United States Patent
Takaoka

[11] Patent Number: 5,989,762
[45] Date of Patent: Nov. 23, 1999

[54] METHOD OF PRODUCING A SEMICONDUCTOR DEVICE

[75] Inventor: Hajime Takaoka, Tokyo, Japan

[73] Assignee: NEC Corporation, Tokyo, Japan

[21] Appl. No.: 08/812,246

[22] Filed: Mar. 6, 1997

[30] Foreign Application Priority Data

Mar. 6, 1996 [JP] Japan .................................. 8-048537

[51] Int. Cl.⁶ ................................ G03C 5/00; G03F 9/00
[52] U.S. Cl. .............................. 430/30; 430/22; 356/399; 356/401
[58] Field of Search ..................... 430/22, 30; 356/399, 356/401

[56] References Cited

U.S. PATENT DOCUMENTS

| | | | |
|---|---|---|---|
| 3,690,881 | 9/1972 | King | 96/27 |
| 3,963,489 | 6/1976 | Cho | 96/27 R |
| 5,532,091 | 7/1996 | Mizutani | 430/22 |
| 5,643,699 | 7/1997 | Waldner | 430/22 |
| 5,656,402 | 8/1997 | Kasuga | 430/22 |
| 5,674,651 | 10/1997 | Nishi | 430/22 |
| 5,695,897 | 12/1997 | Mitome et al. | 430/22 |
| 5,798,195 | 8/1998 | Nishi | 430/22 |
| 5,856,054 | 1/1999 | Tomimatu | 430/22 |

*Primary Examiner*—Nam Nguyen
*Assistant Examiner*—Steven H. VerSteeg
*Attorney, Agent, or Firm*—Foley & Lardner

[57] ABSTRACT

An alignment correcting method for an aligner is disclosed. A designated number of wafers are selected out of a single lot and have their alignment marks measured in terms of coordinates. Subsequently, a preselected number of wafers are selected out of the wafers undergone measurement in the descending order with respect to closeness to a mean value or a center value of scattering, exposed, and then developed. An alignment correction value is calculated on the basis of the developed wafers.

7 Claims, 4 Drawing Sheets

METHOD OF PRODUCING A SEMICONDUCTOR DEVICE

BACKGROUND OF THE INVENTION

The present invention relates to a method of producing a semiconductor device and, more particularly, to an alignment correcting method for a projection aligner or similar aligner.

For the production of a semiconductor device, photolithography is repeated several tens of times with a wafer and followed by etching and doping until a desired circuit has been formed in the wafer. Every time photolithography is effected, the wafer is positioned on the basis of its alignment mark, and then exposed. The alignment mark is used to prevent the wafer from being misaligned with an underlying pattern.

On the other hand, light for alignment usually has a longer wavelength than light for exposure so as not to expose the resist (i.e., photoresist). This brings about a problem that the light for exposure and the light for alignment are each focused to a particular position at a resist film and an $SiO_2$ film provided on a semiconductor substrate, resulting in an error in overlay accuracy. This problem occurs despite the use of the lens system of the same stepper and is aggravated due to the fact that the light for alignment is passed even through an exclusive optical system for alignment. More, from several films to more than ten films are formed above the alignment mark in consecutive layers and etched during the production of a semiconductor device. This renders the sectional shape of the alignment mark asymmetrical. The asymmetrical section of the alignment mark directly translates into an asymmetrical alignment signal. As a result, an alignment sensor fails to locate the alignment mark at the true position of the mark.

While a pilot wafer has customarily been used to correct a measurement error ascribable to the alignment sensor, it is difficult to correct the error with accuracy at all times. In addition, the conventional exposing procedure is not efficient.

SUMMARY OF THE INVENTION

It is therefore an object of the present invention to provide a method of producing a semiconductor device and capable of performing adequate alignment correction by use of pilot wafers to thereby realize exposure suffering from a minimum of overlay error.

It is another object of the present invention to provide a method of producing a semiconductor device capable of selecting pilot wafers at a time to thereby promote efficient exposure.

A method of producing a semiconductor device of the present invention begins with a step of measuring coordinates of one or more alignment marks over a designated number of wafers belonging to a single lot to thereby produce measured values. Either a mean value or a center value of the measured values or deviations of the measured values from a preselected value is calcuated. A preselected number of wafers are selected in the descending order with respect to closeness to the mean value or the center value, and the preselected number of wafers are exposed and developed. An alignment correction value is calculated from the results of development effected with the preselected number of wafers. The alignment correction value is caused to be reflected on mask alignment of the other wafers belonging to the same lot or wafers belonging to another lot.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
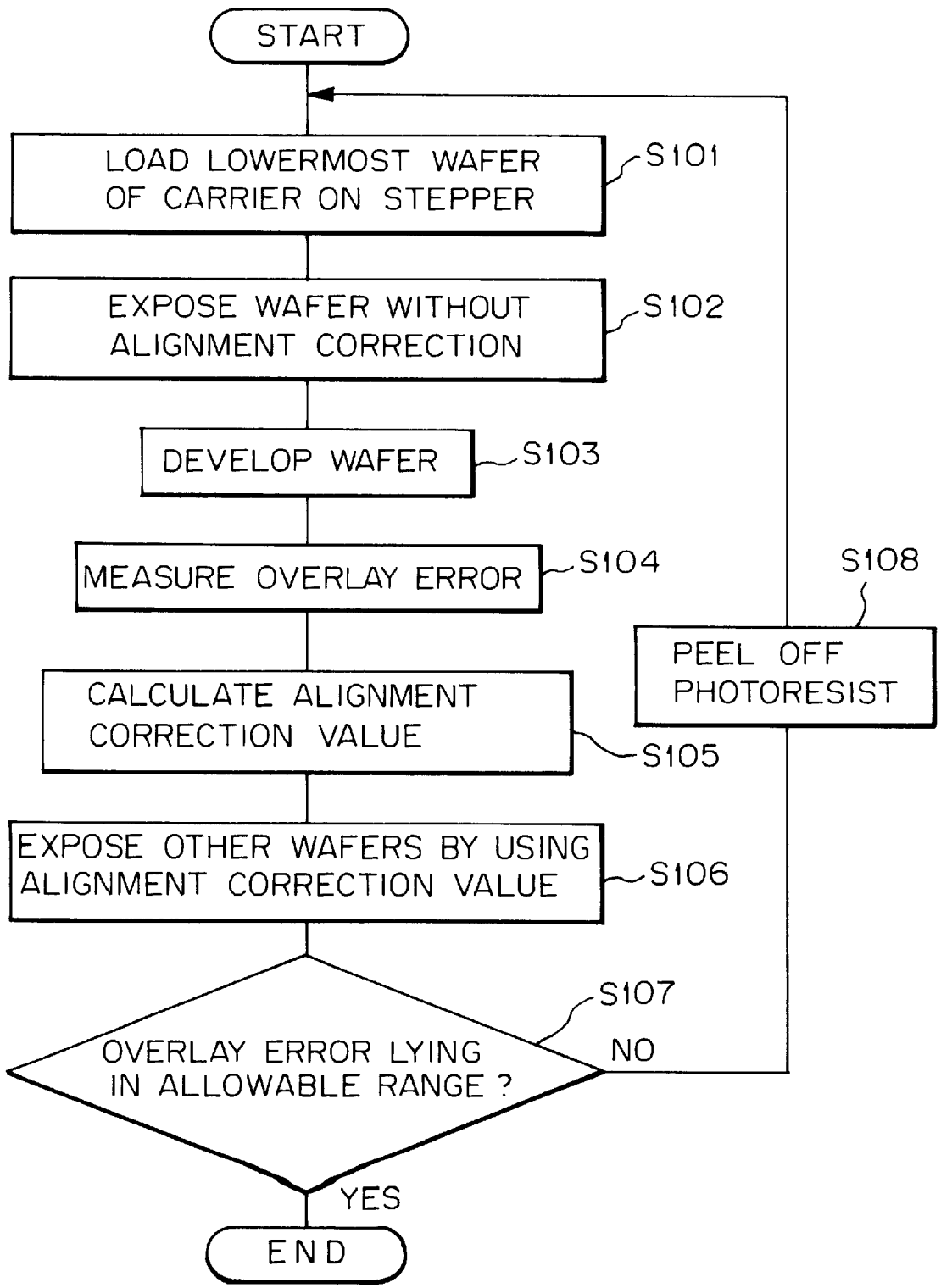
FIG. 1 is a flowchart demonstrating a conventional alignment correcting procedure.

To better understand the present invention, a conventional alignment correcting method practicable with an aligner, as shown in FIG. 1, is described. Generally, a stack of wafers are transferred to an aligner by a carrier. The carrier usually accommodates about twenty-five wafers and constitutes a "lot" together with another carrier. In a single wafer transfer system, the wafers are sequentially picked out of the carrier, the lowermost wafer being first. After processing, the wafer picked out first is returned to its original or lowermost position in the same carrier or brought to the uppermost position in another carrier.

As shown in FIG. 1, the first or lowermost carrier of a single lot is produced from a carrier and then loaded on an aligner or stepper as a pilot wafer (step S101). The wafer loaded on the aligner is positioned without any correction using an alignment mark, and then exposed by a step-and-repeat scheme (step S102). The exposure is followed by development (step S103). Subsequently, an error in overlay accuracy, or overlay error, is measured (step S104). For the measurement of the overlay error, slide calipers may be formed on the underlayer beforehand and compared with a developed photoresist pattern. If the overlay error of the above wafer does not lie in a standard allowable range, another wafer, e.g., the second wafer from the bottom is substituted for the first wafer as a pilot wafer, and the above procedure is repeated.

If the overlay error lies in the allowable range, as determined in the step S104, a correction value as to alignment is calculated on the basis of the overlay error (step S105). The other wafers of the same lot are exposed and then developed while being corrected in alignment on the basis of the correction value determined in the step S105 (S106). Subsequently, the wafers have their overlay errors checked one by one (step S107). The wafers not meeting the standard have their photoresist peeled off (step S108).

The process scattering of the same lot is close to a regular distribution. Therefore, the probability that the lowermost wafer selected as a pilot wafer is close to the margin of the process scattering of the lot is high. For example, assume that when all the wafers are exposed without correction, that the alignment errors ascribable to the process scattering lie in the regular distribution having a mean value of 0 $\mu$m and a standard deviation $\sigma$ of 0.088 m$\mu$. Then, the alignment correction value should optimally be zero. However, the probability that the alignment error of the pilot wafer exceeds the range of ±0.05 $\mu$m due to the process scattering is as high as 0.62. This means that the alignment correction using the pilot wafer brings about overlay errors exceeding 0.05 $\mu$m with the probability of 62%.

Further, the overlay error after the exposure and development is apt to fail to meet the standard. Then, the same procedure must be repeated with one or more other wafers, or pilot wafers, until the overlay error meets the standard. As a result, a long period of time is necessary for the exposure to be completed.

Figure 2:
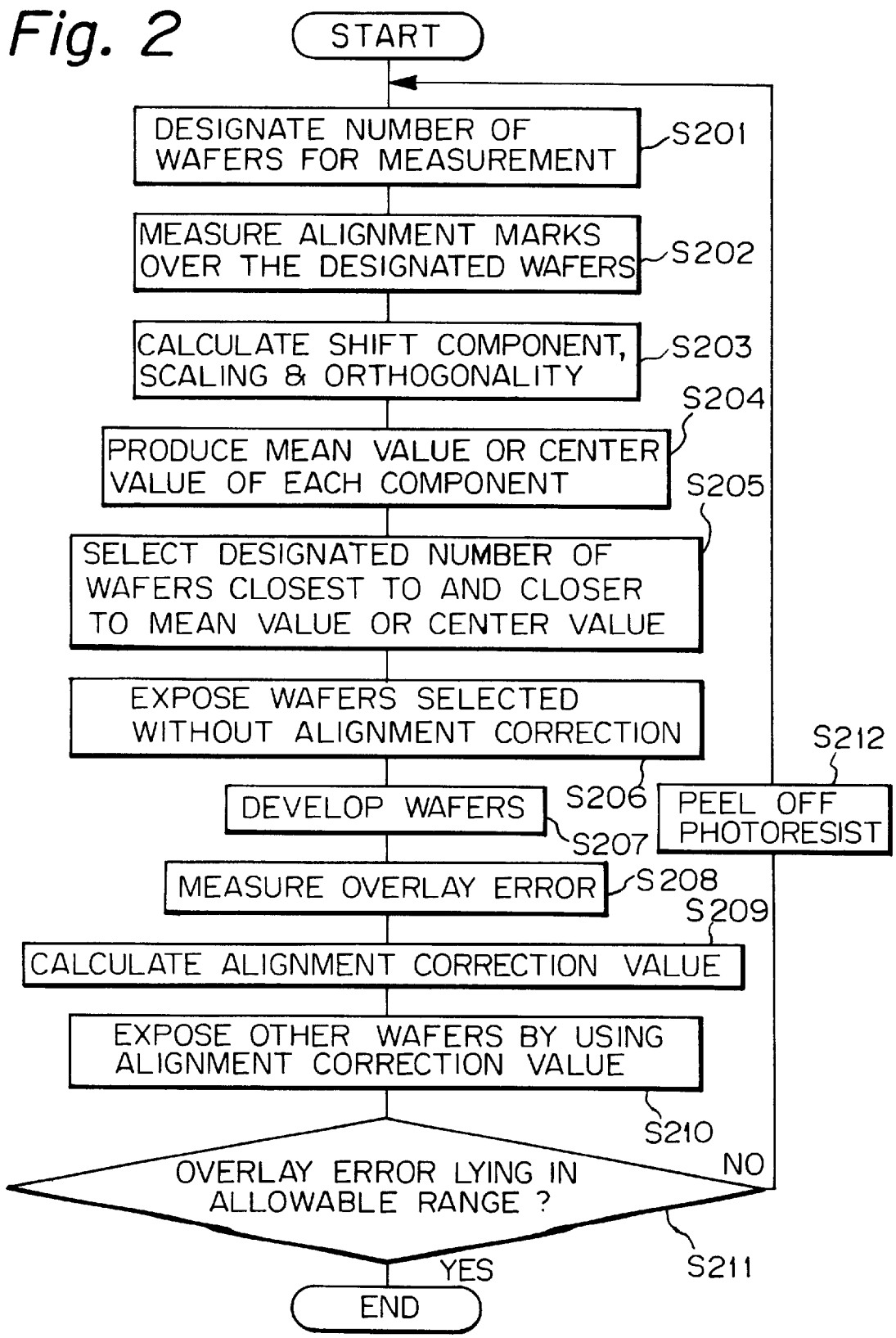
FIG. 2 is a flowchart showing an alignment correcting method embodying the present invention.

Referring to FIG. 2, an alignment correcting method embodying the present invention will be described. As shown, the number of wafers for computing an alignment correction value, i.e., for measuring alignment marks, and the number of wafers for measuring overlay errors are input to an aligner or stepper by hand or on an on-line basis (step S201). Subsequently, an alignment sensor measures, in a wafer plane, the coordinates of an alignment mark at two or more points over the designated number of wafers (step S202). Then, the deviations of the measured values of the alignment marks from a preselected or designed value is calculated. The calculated deviations are decomposed into a positional shift component, a stretch of the wafer (scaling hereinafter), and an orthogonality in shot arrangement. Thereafter, a center value or a mean value is produced with respect to each of the above items (step S203).

Figure 3:
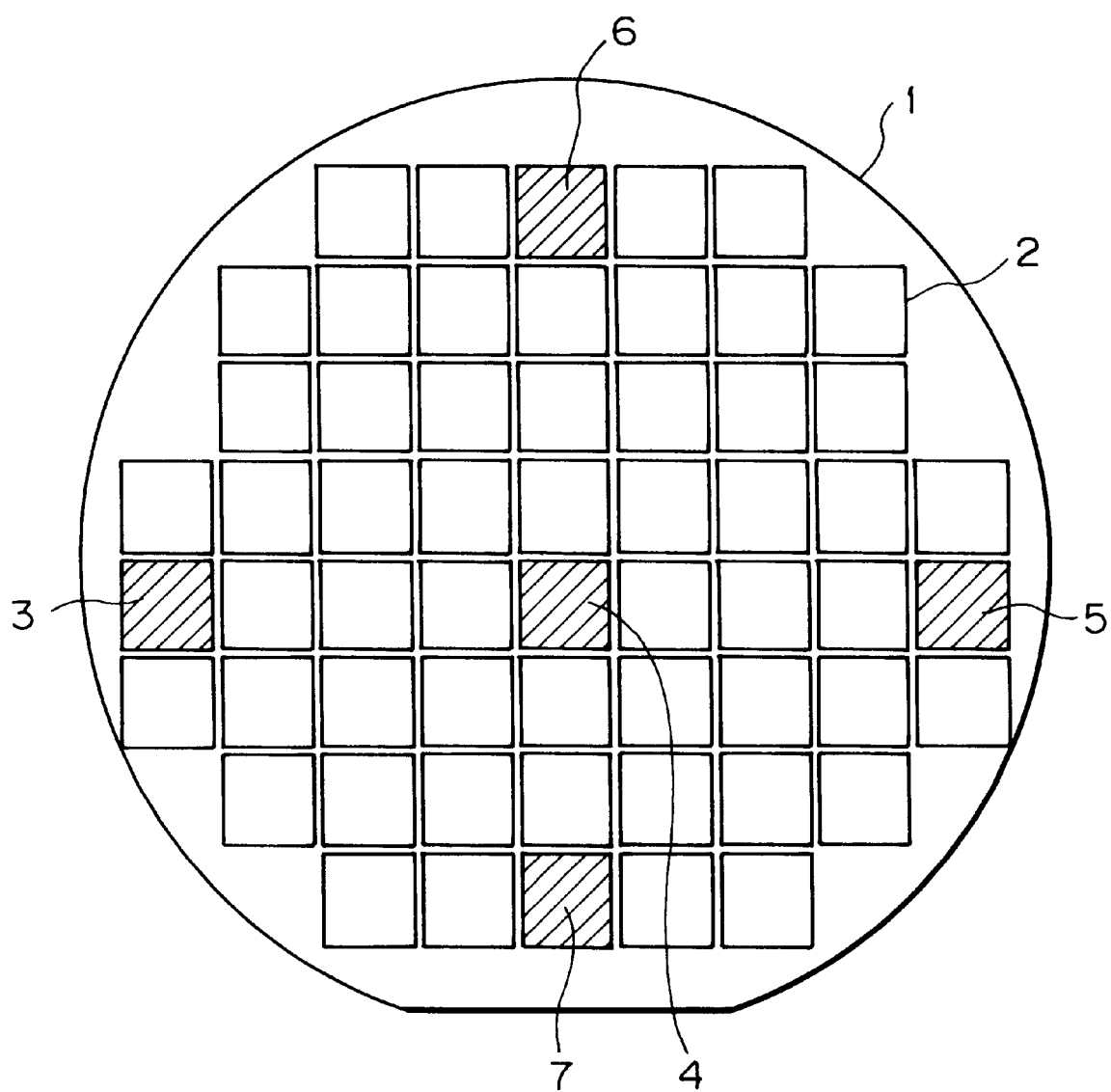
FIG. 3 shows specific points for measuring an alignment mark and useful for understanding the embodiment shown in FIG. 2.

As shown in FIG. 3, each wafer is measured at five different points in the wafer plane. FIG. 3 shows a wafer 1 selected, a exposure shot area (chip) 2, and a first to a fifth points for measurement 3, 4, 5, 6 and 7 respectively represented by coordinates (X1,Y1), (X2,Y2), (X3,Y3), (X4,Y4) and (X5,Y5). Assuming that a deviation at each point for measurement is (Xi,Yi), then, the shift component, scaling and orthogonality are expressed as:

shift component

X: $\Sigma Xi/5$

Y: $\Sigma Yi/5$ scaling

X: $(X_1-X_3) \times 10^6/L$

Y: $(Y_4-Y_5) \times 10^6/L$ orthogonality $(Y_1-Y_3+X_5-X_4)/2$

A mean value or a center value of the individual component is calculated (step S204). Subsequently, the designated (e.g., certain) number of wafers are selected in the descending order with respect the calculated center value or the mean value (step S205), exposed (step S206), and then developed (step S207). After the development, the overlay error between the resulting photoresist pattern and the underlayer pattern is measured (step 208).

In the step S205, a single wafer is, in many cases, close to the mean values (center value) as to all the above three different components. However, if the alignment mark is not symmetrical, and if such a tendency is stable within a lot, it is likely that a wafer close to the mean value of the shift component is different from a wafer close to the mean value of scaling and that of orthogonality. In such a case, the wafers will be serially numbered in the descending order with respect to the mean value for each of the shift component, scaling and orthogonality, and then each wafer has its orders in shift component, scaling and orthogonality summed up. The designated number of wafers will be selected in the ascending order with respect to the sum.

Thereafter, the overlay error is decomposed into the above three components, and an alignment correction value is calculated with the individual component (step S209). The calculated correction value is used during the exposure of the other wafers (step S210). Finally, the wafers are individually checked as to the overlay error (step S211). The defective wafers have their photoresist peeled off (step S212).

As stated above, in the illustrative embodiment, wafers closest to and closer to the mean value or the center value of alignment mark measurements are selected, exposed, and then developed. This increases the probability that a wafer around the center of the process scattering is selected as a pilot wafer, thereby promoting adequate alignment correction. For example, assume that five wafers are designated for mark measurement, that a single wafer is subjected to error measurement, and that the alignment errors are regularly distributed with the standard deviation of 0.88 $\mu$m. Then, the probability that a wafer with an alignment error lying in the range of ±0.05 $\mu$m is not selected as a pilot wafer is reduced to below 0.09 inclusive. Therefore, the embodiment promotes the selection of an adequate wafer as a pilot wafer.

Figure 4:
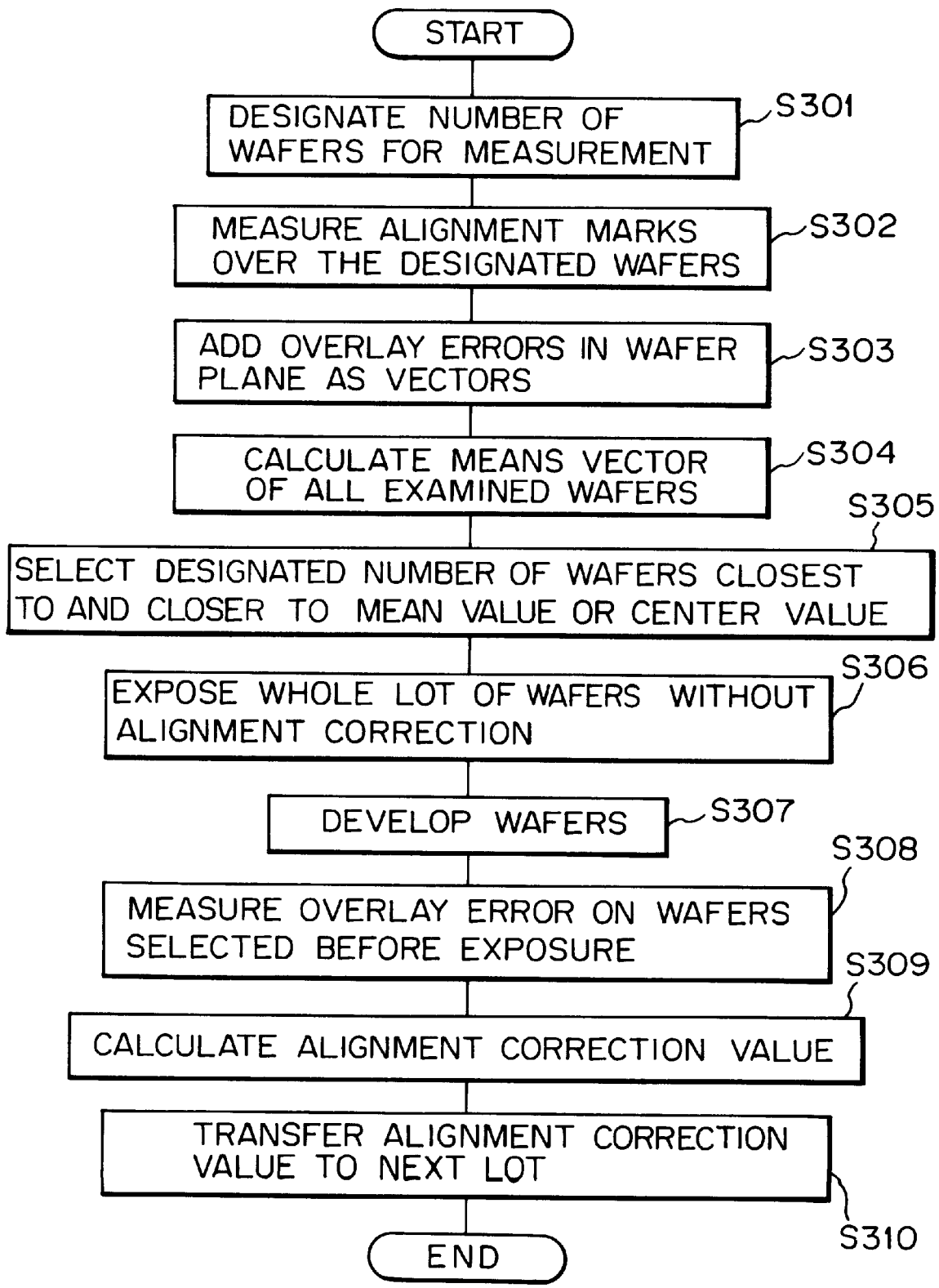
FIG. 4 is a flowchart showing an alternative embodiment of the present invention.

FIG. 4 shows an alternative embodiment of the present invention and applied to a so-called flow pilot system. In this kind of system, all the wafers belonging to the first lot are exposed without any alignment correction. After such wafers have been exposed, one or more of them are extracted and then subjected to overlay error measurement in order to calculate an alignment correction value. The calculated correction value is applied to the next lot. The flow pilot system reduces the processing time because it does not have to perform the exposure, development and overlay error measurement of a pilot wafer before the exposure of the whole lot.

As shown in FIG. 4, the number of wafers for calculating an alignment correction value, i.e., for measuring alignment marks, and the number of wafers for measuring overlay errors are input to an aligner or stepper by hand or on an on-line basis (step S301), as in the previous embodiment. Then, an alignment sensor measures, within a wafer plane, the coordinates of an alignment mark whose position (designed value) is known beforehand, at two or more points over the designated number of wafers for mark measurement (step S302). The deviation of the measured mark value from the designed value is produced point by point in the form of a vector, and the resulting vectors are added in the plane (step S303). Subsequently, the alignment marks are measured in order to produce the mean value or the center value of all of the wafers (step S304).

The designated number of wafers for error measurement are selected in the descending order with respect to the closeness to the mean value or the center value (step S305). Then, all the wafers belonging to the lot are exposed without any alignment correction (step S306), and then developed (step S307). After the development, the overlay error of the pilot wafers selected before the exposure of the lot is measured (step S308). Subsequently, an alignment correction error is calculated on the basis of the measured overlay error (step S309). The alignment correction error is used during the exposure of the next lot of wafers (step S310).

In this embodiment, the vectors of the deviations resulting from alignment measurement are produced wafer by wafer, and then the mean value or the center value of the vectors is calculated. Alternatively, use may be made of the mean value or the center value of the deviations (or their decomposed values), as in the previous embodiment. Conversely, the previous embodiment may use the vector scheme, if desired.

While the above embodiments each determines the mean value or the center value of the deviations of measured values, the mean value or the center value of the measured values themselves may be used in order to produce an alignment correction value.

In summary, in accordance with the present invention, alignment measurement is effected with a plurality of wafers, and then alignment correction is effected with the wafer closest to the mean value or the center value of deviations selected as a pilot wafer. This insures adequate alignment correction at all times. Should a wafer for pilot exposure be selected at random, the wafer might not be located around the center of the process scattering range within a lot, as discussed earlier. Further, it is little likely that the wafer selected as a pilot wafer and undergone exposure has an overlay error exceeding an allowable range and must be replaced with another pilot wafer. Therefore, the present invention realizes high-speed processing.

Various modifications will become possible for those skilled in the art after receiving the teachings of the present disclosure without departing from the scope thereof.

What is claimed is:

1. An alignment method for producing a semiconductor device, comprising the steps of:
   (a) measuring coordinates of at least one alignment mark of a first certain number of wafers belonging to a lot of wafers to thereby produce measured values corresponding to each wafer of said first certain number of wafers;
   (b) calculating at least one of a first result of:
      (1) a mean value of said plurality of measured values;
      (2) a center value of said plurality of measured values;
      (3) a mean value of deviations of said measured values from a preselected value; and
      (4) a center value of deviations of said measured values from said preselected value;
   (c) selecting at least one wafer as a pilot wafer from among said first certain number of wafers by choosing said pilot wafer having its measured values closest to said first result;
   (d) exposing and developing said pilot wafer;
   (e) calculating an alignment correction value by measuring an overlay error of said exposed and developed pilot wafer; and
   (f) adjusting a mask alignment of wafers in said lot in accordance with said alignment correction value.

2. An alignment method as recited in claim 1, wherein said selecting step comprises selecting a second certain number of wafers from among first certain number of wafers, said second certain number of wafers having their respective measured values closest to said first result, said method further comprising the steps of:
   exposing and developing said second certain number of wafers;
   calculating an alignment correction value by measuring an overlay error of said exposed and developed second certain number of wafers; and
   adjusting a mask alignment of wafers in said lot in accordance with said alignment correction value.

3. A method as recited in claim 2, wherein said calculating of said alignment correction value comprises:
   utilizing data resulting from a comparison between a plurality of slide calipers formed beforehand and at least one photoresist pattern of said second certain number of wafers after said developing.

4. An alignment method as recited in claim 1 wherein said calculating of said alignment correction value comprises:
   utilizing data resulting from a comparison between a plurality of slide calipers formed beforehand and at least one photoresist pattern of said pilot wafer after said developing.

5. An alignment method for producing a semiconductor device, comprising the steps of:
   (a) measuring coordinates of at least one alignment mark of a first certain number of wafers belonging to a lot of wafers to thereby produce measured values corresponding to each wafer of said first certain number of wafers;
   (b) calculating deviations of said measured values from a preselected value;
   (c) producing a positional shift component, a scaling component, and an orthogonality component utilizing mathematical functions of deviations of said measured values from a preselected value;
   (d) selecting a second certain number of wafers from among said first certain number of wafers by choosing wafers from among said first certain number of wafers which have their measured values closest to a mean or center value of each of said positional shift component, said scaling component, and said orthogonality component;
   (e) exposing and developing said second certain number of wafers;
   (f) calculating an alignment correction value by measuring an overlay error of said exposed and developed second certain number of wafers; and
   (g) adjusting a mask alignment of wafers in said lot in accordance with said alignment correction value.

6. A alignment method as recited in claim 5 wherein said step of calculating the alignment correction value is performed with respect to each of said positional shift component, said scaling component, and said orthogonality component.

7. An alignment method for producing a semiconductor device, comprising the steps of:
   (a) measuring coordinates of at least one alignment mark of a first certain number of wafers belonging to a lot of wafers to thereby produce measured values corresponding to each wafer of said first certain number of wafers;
   (b) calculating deviations of said measured values from a preselected value;
   (c) expressing said deviations in the form of vectors;
   (d) selecting a second certain number of wafers from among said first certain number of wafers by choosing wafers from among said first certain number of wafers which have their vectors closest to a mean or center value of said vectors;
   (e) exposing and developing said second certain number of wafers;
   (f) calculating an alignment correction value by measuring an overlay error of said exposed and developed second certain number of wafers; and
   (g) adjusting a mask alignment of wafers in said lot in accordance with said alignment correction value.

* * * * *